(12) United States Patent
Nygren et al.

(10) Patent No.: US 8,245,073 B2
(45) Date of Patent: Aug. 14, 2012

(54) METHOD AND APPARATUS SYNCHRONIZING INTEGRATED CIRCUIT CLOCKS

(75) Inventors: Aaron Nygren, San Francisco, CA (US); Ming-Ju Edward Lee, San Jose, CA (US); Shadi Barakat, San Mateo, CA (US); Xiaoling Xu, Cupertino, CA (US); Toan Duc Pham, San Jose, CA (US); Warren Fritz Kruger, Sunnyvale, CA (US); Michael Litt, Toronto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 397 days.

(21) Appl. No.: 12/509,409

(22) Filed: Jul. 24, 2009

(65) Prior Publication Data
US 2011/0019787 A1     Jan. 27, 2011

(51) Int. Cl.
*G06F 1/12*     (2006.01)
(52) U.S. Cl. .......................... 713/400; 713/600; 711/167

(58) Field of Classification Search ................... 713/400, 713/600; 711/167
See application file for complete search history.

(56) References Cited

U.S. PATENT DOCUMENTS
7,181,639 B2 *    2/2007    Chua-Eoan et al. .......... 713/600
* cited by examiner

*Primary Examiner* — Thuan Du
(74) *Attorney, Agent, or Firm* — Volpe and Koenig, P.C.

(57) ABSTRACT

Embodiments described herein include a method and system for synchronizing clocks between coupled integrated circuits (ICs) in a computer system. According to an embodiment, a dedicated timing pin is provided on a first IC. The first IC configures a second IC to change a pin assignment, so that the second IC interprets a signal sent on the timing pin by the first IC and received on the reassigned pin as a request to transmit a return signal. The return signal is received on the timing pin. The return signal is used to determine whether timing should be adjusted by the first IC. In an embodiment a clock and data recover (CDR) circuit compares the signal sent to the signal received in order to make the determination. In an embodiment the first IC is a processor-based device, and the second IC is a memory device controlled by the first device.

22 Claims, 10 Drawing Sheets

| | BA3 | BA2 | BA1 | BA0 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|---|
| MR0 | 0 | 0 | 0 | 0 | 0 | 0 | Write Recovery (WR) | | | TM | CAS Latency (CLmrs) | | | | Write Latency (WLmrs) | | |
| MR1 | 0 | 0 | 0 | 1 | 0 | PLL Reset | ABI | WDBI | RDBI | PLL DLL | Cal Upd | ADR/CMD Termination | | Data Termination | | Driver Strength | |
| MR2 | 0 | 0 | 1 | 0 | 0 | ADR/CMD Termination Offset | | | | Data and WCK Termination Offset | | | | OCD Pullup Driver Offset | | OCD Pulldown Driver Offset | |
| MR3 | 0 | 0 | 1 | 1 | 0 | Bank Groups | | WCK Termination | | Info | | | | RDQS WCK Mode 2CK | WCK 23Inv | WCK 01Inv | Self Refresh |
| MR4 | 0 | 1 | 0 | 0 | 0 | EDC 13Inv | WR CRC | RD CRC | CRC Read Latency (CRCRL) | | CRC Write Latency (CRCWL) | | | EDC Hold Pattern | | | |
| MR5 | 0 | 1 | 0 | 1 | 0 | RAS | | | | | | | PLL/DLL Bandwidth (PLLBW) | | LP3 | LP2 | LP1 |
| MR6 | 0 | 1 | 1 | 0 | 0 | VREFD Offset Upper 2 bytes | | | | VREFD Offset Lower 2 bytes | | | | Auto VREFD | VREFD Merge | WCK PIN | |
| MR7 | 0 | 1 | 1 | 1 | 0 | DCC | | VDD Range | | Half VREFD | Temp Sense | DQ PreA | Auto Sync Mode | LF Mode | PLL DelC | PLL FLock | PLL Stdby |
| MR8 | 1 | 0 | 0 | 0 | 0 | | | | | | | | | | WR EHF | CL EHF | EHF |
| MR15 | 1 | 1 | 1 | 1 | 0 | RFU | ADT | MRE MF1 | MRE MF0 | X | X | X | X | X | X | X | X |

| | BA3 | BA2 | BA1 | BA0 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|---|
| MR0 | 0 | 0 | 0 | 0 | 0 | Write Recovery (WR) | | | TM | CAS Latency (CLmrs) | | | | Write Latency (WLmrs) | | | |
| MR1 | 0 | 0 | 0 | 1 | 0 | PLL Reset | ABI | WDBI | RDBI | PLL DLL | Cal Upd | ADR/CMD Termination | | Data Termination | | Driver Strength | |
| MR2 | 0 | 0 | 1 | 0 | 0 | ADR/CMD Termination Offset | | | Data and WCK Termination Offset | | | | OCD Pullup Driver Offset | | OCD Pulldown Driver Offset | | |
| MR3 | 0 | 0 | 1 | 1 | 0 | Bank Groups | | WCK Termination | | Info | | | | RDQS Mode | WCK 2CK | WCK 23Inv | WCK 01Inv | Self Refresh |
| MR4 | 0 | 1 | 0 | 0 | 0 | EDC 13Inv | WR CRC | RD CRC | CRC Read Latency (CRCRL) | | CRC Write Latency (CRCWL) | | | EDC Hold Pattern | | | | |
| MR5 | 0 | 1 | 0 | 1 | 0 | RAS | | | | | | | PLL/DLL Bandwidth (PLLBW) | | LP3 | LP2 | LP1 |
| MR6 | 0 | 1 | 1 | 0 | 0 | VREFD Offset Upper 2 bytes | | | VREFD Offset Lower 2 bytes | | | | VREFD | Auto VREFD | WCK Merge | WCK PIN |
| MR7 | 0 | 1 | 1 | 1 | 0 | DCC | | VDD Range | | Half VREFD | Temp Sense | DQ PreA | | Auto Sync | LF Mode | PLL DelC | PLL FLock | PLL Stdby |
| MR8 | 1 | 0 | 0 | 0 | 0 | RFU | | WCDR PRE | | WCDRL | | | | WCDR AREF | WCDR x16 | WR EHF | CL EHF |
| MR15 | 1 | 1 | 1 | 1 | 0 | RFU | ADT | MRE MF1 | MRE MF0 | x | x | x | x | x | x | x | x |

FIG.8

|   | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
|   | BYTE 0 | | | | | | | | | BYTE 1 | | | | |
| A | $V_{SSQ}$ | DQ1 | $V_{SSQ}$ | DQ0 | $V_{PP}$, NC | | | | | VREFD, WCDR0 | DQ8 | $V_{SSQ}$ | DQ9 | $V_{SSQ}$ |
| B | $V_{DDQ}$ | DQ3 | $V_{DDQ}$ | DQ2 | $V_{SS}$ | | | | | $V_{SS}$ | DQ10 | $V_{DDQ}$ | DQ11 | $V_{DDQ}$ |
| C | $V_{SSQ}$ | EDC0 | $V_{SSQ}$ | $V_{SSQ}$ | $V_{DD}$ | | | | | $V_{DD}$ | $V_{SSQ}$ | $V_{SSQ}$ | EDC1 | $V_{SSQ}$ |
| D | $V_{DDQ}$ | DBI0# | $V_{DDQ}$ | WCK01 | WCK01# | | | | | $V_{SS}$ | $V_{DD}$ | $V_{DDQ}$ | DBI1# | $V_{DDQ}$ |
| E | $V_{SSQ}$ | DQ5 | $V_{SSQ}$ | DQ4 | $V_{DDQ}$ | | | | | $V_{DDQ}$ | DQ12 | $V_{SSQ}$ | DQ13 | $V_{SSQ}$ |
| F | $V_{DDQ}$ | DQ7 | $V_{DDQ}$ | DQ6 | $V_{SSQ}$ | | | | | $V_{SSQ}$ | DQ14 | $V_{DDQ}$ | DQ15 | $V_{DDQ}$ |
| G | $V_{DD}$ | $V_{DDQ}$ | RAS# | $V_{DD}$ | $V_{SS}$ | | | | | $V_{SS}$ | $V_{DD}$ | CS# | $V_{DDQ}$ | $V_{DD}$ |
| H | $V_{SS}$ | $V_{SSQ}$ | $V_{DDQ}$ | A10 A0 | A9 A1 | | | | | BA3 A3 | BA0 A2 | $V_{DDQ}$ | $V_{SSQ}$ | $V_{SS}$ |
| J | MF | RESET# | CKE# | ABI# | A12 RFU, NC | | | | | SEN | CK# | CK | ZQ | VREFC |
| K | $V_{SS}$ | $V_{SSQ}$ | $V_{DDQ}$ | A8 A7 | A11 A6 | | | | | BA1 A5 | BA2 A4 | $V_{DDQ}$ | $V_{SSQ}$ | $V_{SS}$ |
| L | $V_{DD}$ | $V_{DDQ}$ | CAS# | $V_{DD}$ | $V_{SS}$ | | | | | $V_{SS}$ | $V_{DD}$ | WE# | $V_{DDQ}$ | $V_{DD}$ |
| M | $V_{DDQ}$ | DQ31 | $V_{DDQ}$ | DQ30 | $V_{SSQ}$ | | | | | $V_{SSQ}$ | DQ22 | $V_{DDQ}$ | DQ23 | $V_{DDQ}$ |
| N | $V_{SSQ}$ | DQ29 | $V_{SSQ}$ | DQ28 | $V_{DDQ}$ | | | | | $V_{DDQ}$ | DQ20 | $V_{SSQ}$ | DQ21 | $V_{SSQ}$ |
| P | $V_{DDQ}$ | DBI3# | $V_{DDQ}$ | WCK23 | WCK23# | | | | | $V_{SS}$ | $V_{DD}$ | $V_{DDQ}$ | DBI2# | $V_{DDQ}$ |
| R | $V_{SSQ}$ | EDC3 | $V_{SSQ}$ | $V_{SSQ}$ | $V_{DD}$ | | | | | $V_{DD}$ | $V_{SSQ}$ | $V_{SSQ}$ | EDC2 | $V_{SSQ}$ |
| T | $V_{DDQ}$ | DQ27 | $V_{DDQ}$ | DQ26 | $V_{SS}$ | | | | | $V_{SS}$ | DQ18 | $V_{DDQ}$ | DQ19 | $V_{DDQ}$ |
| U | $V_{SSQ}$ | DQ25 | $V_{SSQ}$ | DQ24 | $V_{PP}$, NC | | | | | VREFD, WCDR1 | DQ16 | $V_{SSQ}$ | DQ17 | $V_{SSQ}$ |
|   | BYTE 3 | | | | | | | | | BYTE 2 | | | | |

☐ x32 mode: ON / x16 mode: ON

⌐ ¬ x32 mode: ON / x16 mode: OFF

FIG. 9 A

| | 1 | 2 | 3 | 4 | 5 | | 6 | 7 | 8 | 9 | 10 | 11 | 12 | 13 | 14 |
|---|---|---|---|---|---|---|---|---|---|---|---|---|---|---|---|
| | BYTE 3 | | | | | | | | | | BYTE 2 | | | | |
| A | $V_{SSQ}$ | DQ25 | $V_{SSQ}$ | DQ24 | $V_{PP},$ NC | | | | | | VREFD, WCDR1 | DQ16 | $V_{SSQ}$ | DQ17 | $V_{SSQ}$ |
| B | $V_{DDQ}$ | DQ27 | $V_{DDQ}$ | DQ26 | $V_{SS}$ | | | | | | $V_{SS}$ | DQ18 | $V_{DDQ}$ | DQ19 | $V_{DDQ}$ |
| C | $V_{SSQ}$ | EDC3 | $V_{SSQ}$ | $V_{SSQ}$ | $V_{DD}$ | | | | | | $V_{DD}$ | $V_{SSQ}$ | $V_{SSQ}$ | EDC2 | $V_{SSQ}$ |
| D | $V_{DDQ}$ | DBI3# | $V_{DDQ}$ | WCK23 | WCK23# | | | | | | $V_{SS}$ | $V_{DD}$ | $V_{DDQ}$ | DBI2# | $V_{DDQ}$ |
| E | $V_{SSQ}$ | DQ29 | $V_{SSQ}$ | DQ28 | $V_{DDQ}$ | | | | | | $V_{DDQ}$ | DQ20 | $V_{SSQ}$ | DQ21 | $V_{SSQ}$ |
| F | $V_{DDQ}$ | DQ31 | $V_{DDQ}$ | DQ30 | $V_{SSQ}$ | | | | | | $V_{SSQ}$ | DQ22 | $V_{DDQ}$ | DQ23 | $V_{DDQ}$ |
| G | $V_{DD}$ | $V_{DDQ}$ | CAS# | $V_{DD}$ | $V_{SS}$ | | | | | | $V_{SS}$ | $V_{DD}$ | WE# | $V_{DDQ}$ | $V_{DD}$ |
| H | $V_{SS}$ | $V_{SSQ}$ | $V_{DDQ}$ | A8 A7 | A11 A6 | | | | | | BA1 A5 | BA2 A4 | $V_{DDQ}$ | $V_{SSQ}$ | $V_{SS}$ |
| J | MF | RESET# | CKE# | ABI# | A12 RFU, NC | | | | | | SEN | CK# | CK | ZQ | VREFC |
| K | $V_{SS}$ | $V_{SSQ}$ | $V_{DDQ}$ | A10 A0 | A9 A1 | | | | | | BA3 A3 | BA0 A2 | $V_{DDQ}$ | $V_{SSQ}$ | $V_{SS}$ |
| L | $V_{DD}$ | $V_{DDQ}$ | RAS# | $V_{DD}$ | $V_{SS}$ | | | | | | $V_{SS}$ | $V_{DD}$ | CS# | $V_{DDQ}$ | $V_{DD}$ |
| M | $V_{DDQ}$ | DQ7 | $V_{DDQ}$ | DQ6 | $V_{SSQ}$ | | | | | | $V_{SSQ}$ | DQ14 | $V_{DDQ}$ | DQ15 | $V_{DDQ}$ |
| N | $V_{SSQ}$ | DQ5 | $V_{SSQ}$ | DQ4 | $V_{DDQ}$ | | | | | | $V_{DDQ}$ | DQ12 | $V_{SSQ}$ | DQ13 | $V_{SSQ}$ |
| P | $V_{DDQ}$ | DBI0# | $V_{DDQ}$ | WCK01 | WCK01# | | | | | | $V_{SS}$ | $V_{DD}$ | $V_{DDQ}$ | DBI1# | $V_{DDQ}$ |
| R | $V_{SSQ}$ | EDC0 | $V_{SSQ}$ | $V_{SSQ}$ | $V_{DD}$ | | | | | | $V_{DD}$ | $V_{SSQ}$ | $V_{SSQ}$ | EDC1 | $V_{SSQ}$ |
| T | $V_{DDQ}$ | DQ3 | $V_{DDQ}$ | DQ2 | $V_{SS}$ | | | | | | $V_{SS}$ | DQ10 | $V_{DDQ}$ | DQ11 | $V_{DDQ}$ |
| U | $V_{SSQ}$ | DQ1 | $V_{SSQ}$ | DQ0 | $V_{PP},$ NC | | | | | | VREFD, WCDR0 | DQ8 | $V_{SSQ}$ | DQ9 | $V_{SSQ}$ |
| | BYTE 0 | | | | | | | | | | BYTE 1 | | | | |

☐ x32 mode: ON / x16 mode: ON    ⌐ ⌐ x32 mode: ON / x16 mode: OFF

FIG.9B

METHOD AND APPARATUS SYNCHRONIZING INTEGRATED CIRCUIT CLOCKS

TECHNICAL FIELD

Embodiments as disclosed herein are in the field of synchronizing signal timing between integrated circuit components in a system.

BACKGROUND

In electronic systems containing multiple integrated circuit (IC) components communicating with each other, it is necessary to synchronize the timing of signal transmission and receipt between components in order to avoid timing errors. Timing errors include one or more components failing to accurately interpret electronic signals as correct data. Many phenomena (physical conditions, digital logic errors, etc.) can result in timing errors particularly in systems that operate at speeds and/or have high data throughput rates, as is well known in the art. Typically, many IC components contain timing circuitry and logic devoted to minimizing timing errors. However, it is always desirable to minimize the physical chip area and the power consumed by IC components, especially by the area and power consumed by functions not directly related to the purpose of the system or component. This is particularly true of data storage (also referred to herein as memory) components. The cost of memory components is dramatically affected by increases in amounts of circuitry and area required that are not dedicated to data storage. In addition, extra power consumed that is not directly related to data storage makes a memory component less desirable than a memory component with similar data storage capacity and smaller power requirements. Therefore providing an efficient way of communicating with other system IC components while avoiding timing errors is an aspect of IC design for any type of IC, including memory components Another aspect of IC design is consideration of and compliance with published and recognized industry standards. Compliance with industry standards helps assure that different components for different purposes and from different manufacturers can operate correctly in an IC system.

Figure 1:
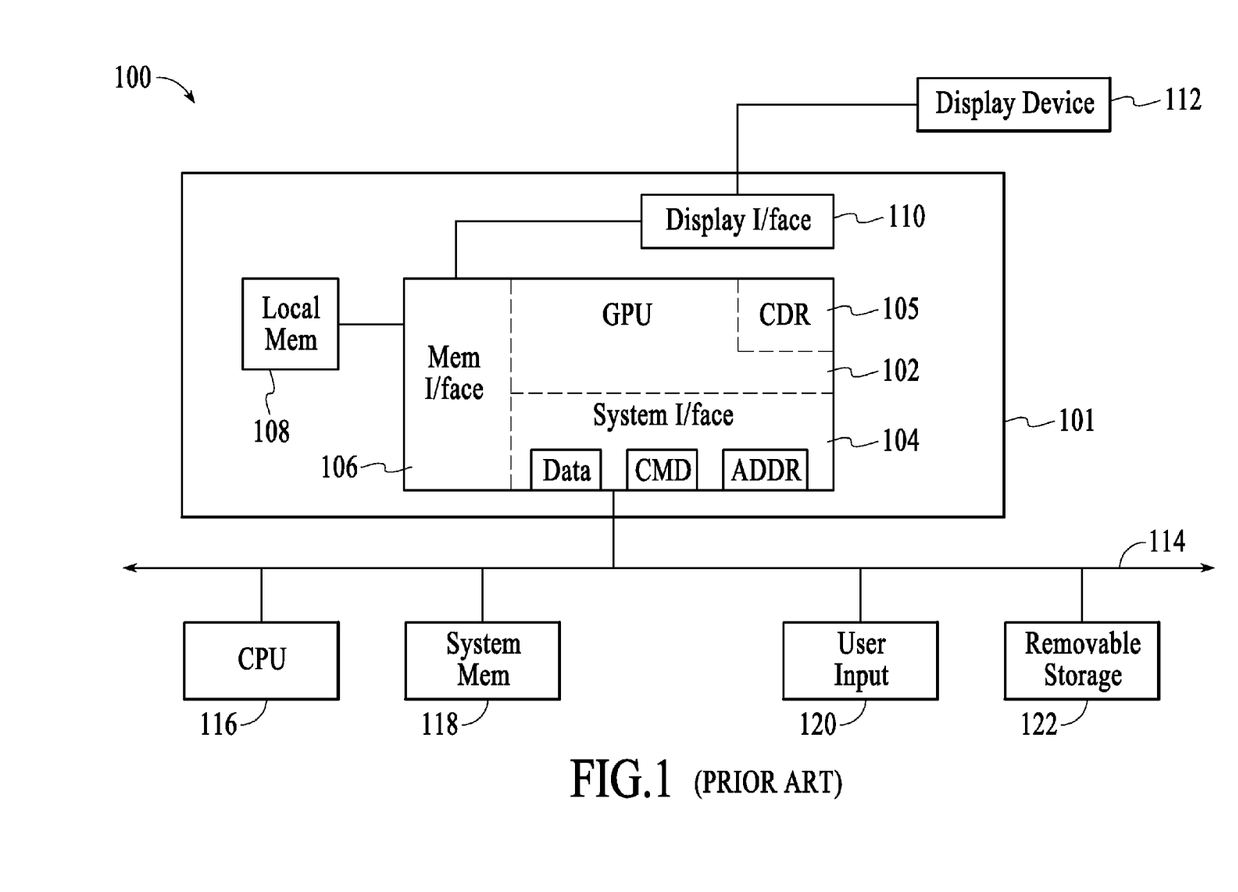
FIG. 1 is a diagram of a computer system showing various system components in the prior art.

FIG. 1 is a diagram of a computer system 100 showing various system components in the prior art. System 100 includes a graphics processing subsystem 101 coupled to a system bus 114. Also coupled to bus 114 are a central processing unit 116, a system memory 118, removable storage 122, and user input device 120. Subsystem 101 includes a graphics processing unit (GPU) 102, including a system interface 104, a memory interface 106, and a clock and data recovery unit (CDR) 105. System interface 104 includes circuitry, logic and physical pins for communicating with other system and subsystem components. As an example, DATA pins, command (CMD) pins, and address (ADDR) pins are shown. Subsystem 101 further includes a local memory 108, and a display interface 110. GPU 102 is an example of a special purpose processor within a computer system. GPU 102 accesses both its local memory 108 and other memory components coupled to bus 114, such as system memory 118, and possibly removable storage 122.

Figure 2:
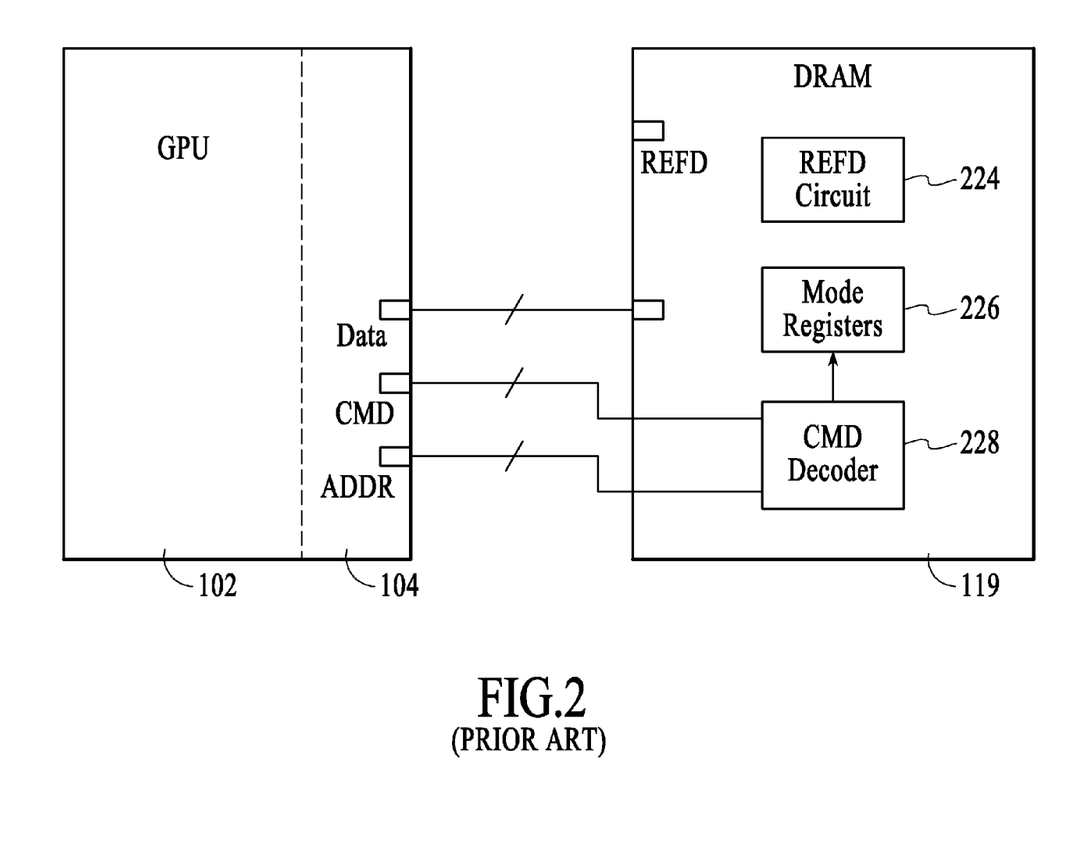
FIG. 2 is a diagram of particular system components in the prior art.

FIG. 2 is a diagram of particular system components in the prior art. GPU 104 communicates with a memory component 119. Memory component 119 may be included in either removable storage 122 or system memory 118, and is just one example of a memory component external to, but accessible to, GPU 102. In the example shown, memory component 119 is a dynamic random access memory DRAM component. DRAM 119 includes a command decoder 228, mode registers 226, and a "reference data" or REFD circuit 224. REFD circuit 224 receives a reference voltage on a REFD pin. In such a previous system, one method for synchronizing timing between GPU 102 and DRAM 119 involves examining the timing of READ data and using that to estimate WRITE timing. A clock signal is sent to DRAM 119, and READ data is returned. Based on the timing of that transaction, timing for a WRITE transaction is estimated. However, this method is rather inaccurate because the actual WRITE transaction is not being examined.

Figure 5:
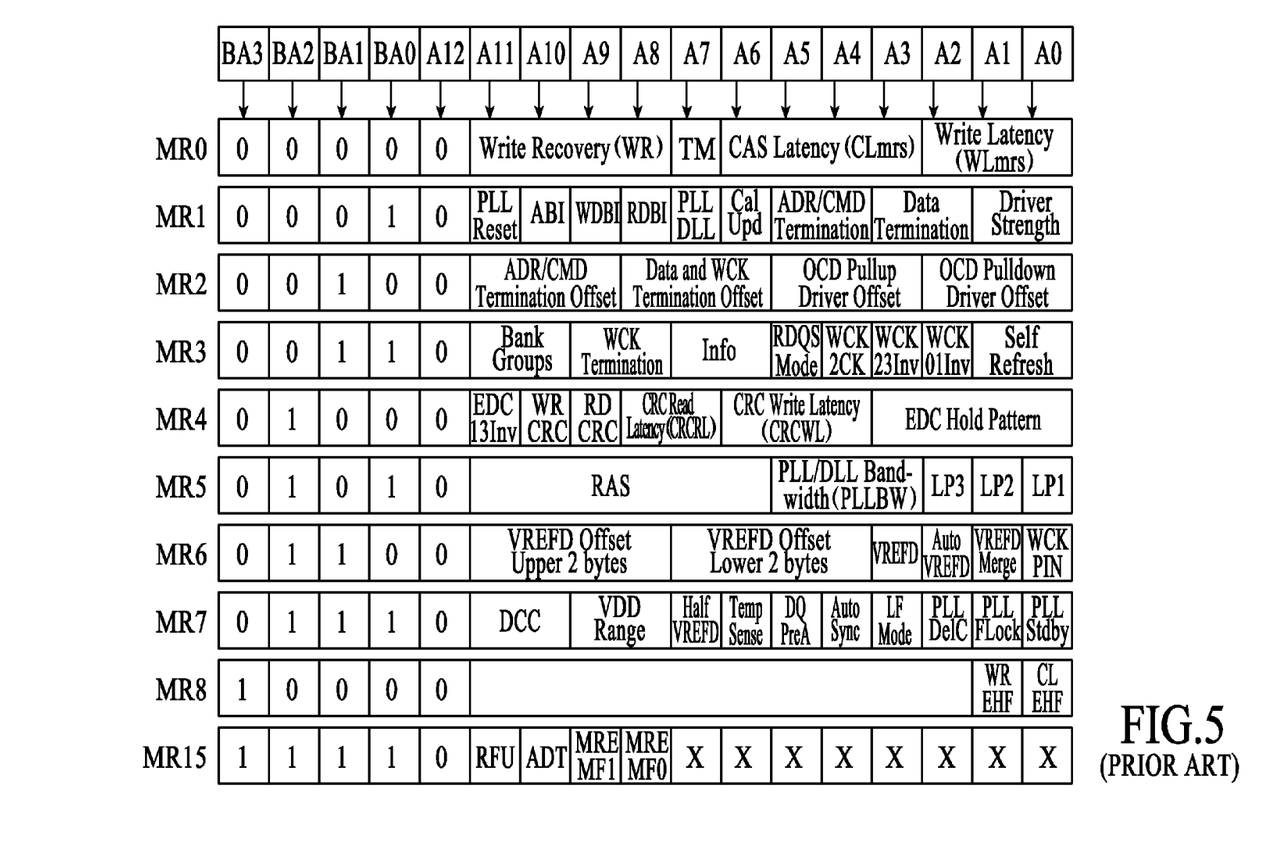
FIG. 5 is a diagram of a system component mode register in the prior art.
Figure 6:
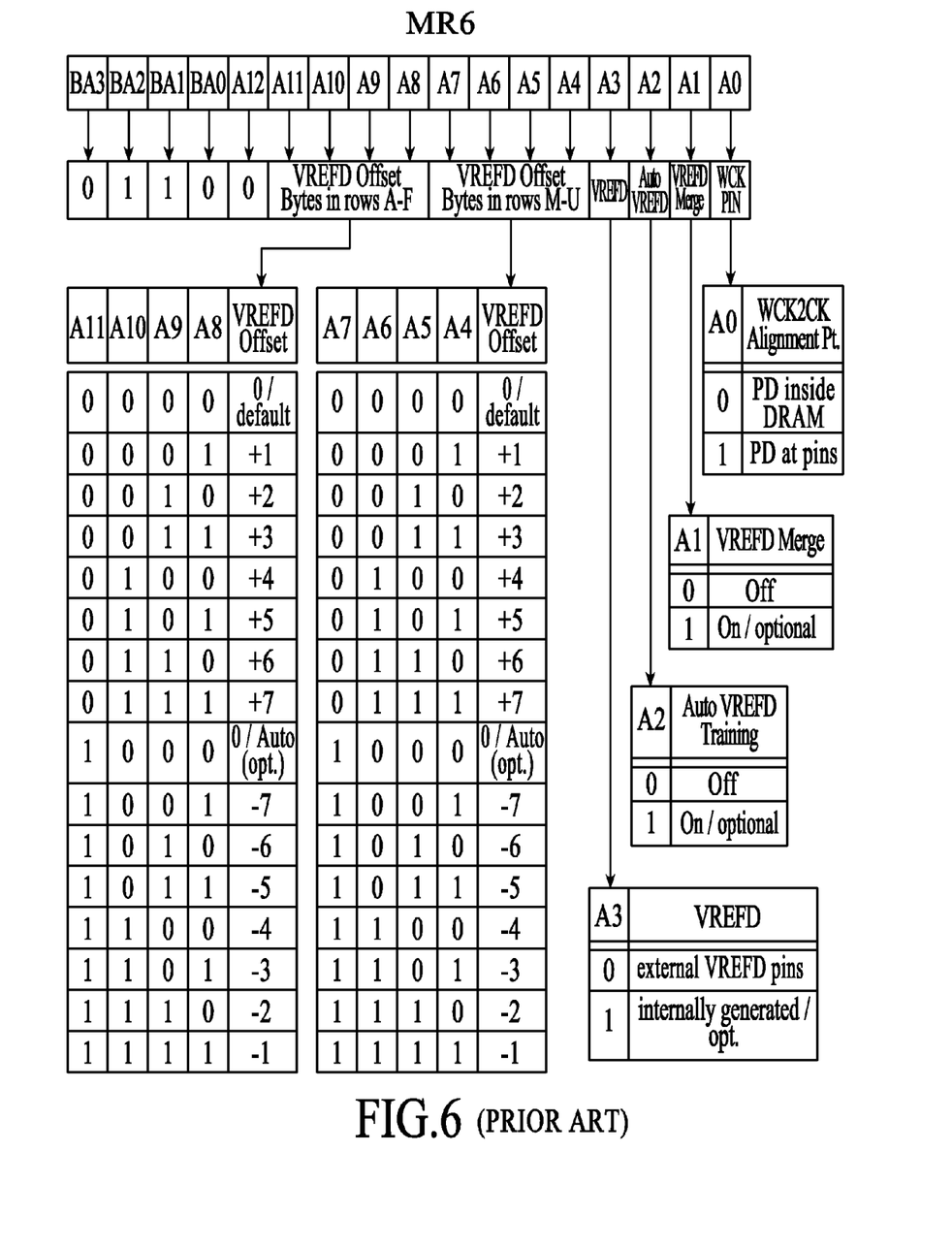
FIG. 6 is a diagram of one of the mode registers of FIG. 5.

FIG. 5 is a diagram of a system component mode register in the prior art. This example includes some of the mode registers in a DRAM compliant with an existing GDDR standard. The GDDR5 standard is referred to here, but is not meant to be exclusive reference. The GDDR specification includes register that are configurable by a controlling component in a system. For example, mode register 8 (MR8) includes blank data fields to signify fields that can be overwritten by a controlling component. FIG. 6 is a diagram of a definition mode register 6 of FIG. 5 in the prior art. Mode register 6 (MR6) includes fields to configure the VREF function of DRAM 119.

It would be desirable for an IC to include an efficient method and apparatus for efficiently providing for minimizing timing error in an IC system while considering applicable industry standards.

DETAILED DESCRIPTION

Embodiments described herein include a method and system for synchronizing clocks between coupled integrated circuits (ICs) in a computer system. Embodiments reduce the IC circuit area and power consumption used for clock synchronization. In an embodiment, a first IC includes the capability to monitor and adjust clock timing between the IC and another IC. The IC typically controls the other IC, and the other, controlled IC typically has a highly specific function such as data storage. A data storage (also referred to as memory) components are one example of such a controlled IC, but the example is not exclusive. Embodiments reduce the circuitry and power consumption devoted to clock synchronization by the memory, for example by placing circuitry on the controlling IC, including circuitry for sending information to the controlled IC, receiving information in response from the controlled IC, and comparing the sent information with the received information to determine whether a clock adjustment should be made. In an embodiment, a dedicated clock and data recovery (CDR) pin is included on the controlling IC for sending and receiving the information. In an embodiment, the controlling IC configures the controlled IC such that a pin of the controlled IC is reassigned to receive the sent information instead of other information, and to send information back to the controlling IC.

Figure 3:
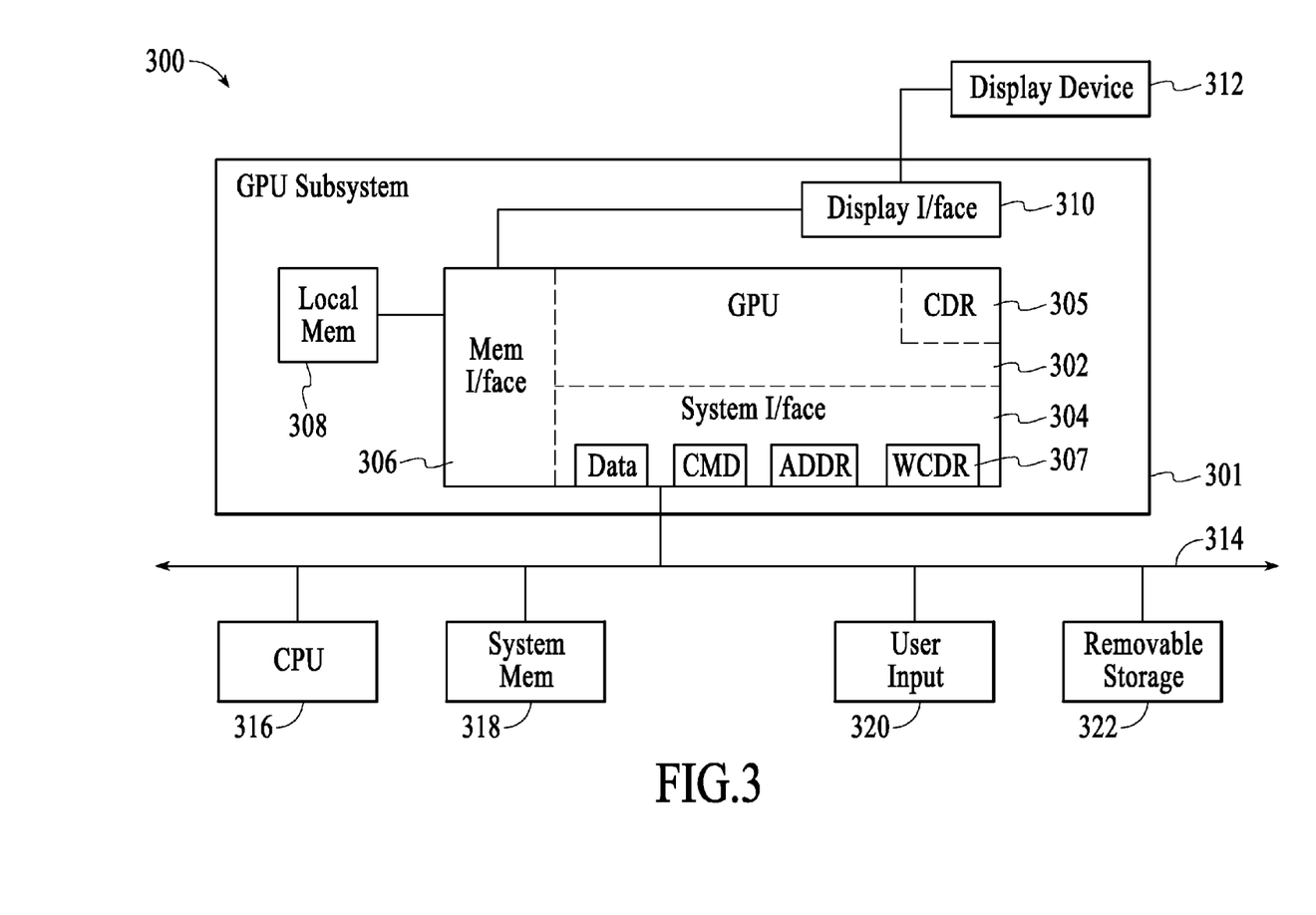
FIG. 3 is a diagram of a computer system showing various system components according to an embodiment.

FIG. 3 is a diagram of a computer system 300 showing various system components. System 300 includes a graphics processing subsystem 301 coupled to a system bus 314. Also coupled to bus 314 are a central processing unit 316, a system memory 318, removable storage 322, and user input device 320. Subsystem 301 includes a graphics processing unit (GPU) 304, including a system interface 304, a memory interface 306, and a clock and data recovery unit (CDR) 305. Subsystem 301 further includes a local memory 308, and a display interface 310. GPU 302 is an example of a special purpose processor within a computer system. GPU 302 accesses both its local memory 308 and other memory components coupled to bus 314, such as system memory 318, and possibly removable storage 322. As will be understood in the art, processor 302 could be embodied as another component such as a central processing unit (CPU), a bridge device (e.g., a northbridge or southbridge device) or, alternatively, part of another component (e.g., a device providing both GPU and bridge functionality, a combined CPU and GPU device, etc.).

System interface 304 includes circuitry, logic and physical pins used to communicate with other system and subsystem components. In an embodiment, in addition to DATA, CMD AND ADDR pins, a write clock and data recovery (WCDR) pin 307 is included. WCDR pin 307, accordingly to an embodiment, is a dedicated pin used to transmit information to memory components external to the subsystem 301, and to receive information in response from the memory components external to the subsystem 301. As further described below, WCDR pin 307 is used for timing synchronization between subsystem 301 and external memory components. The methods of timing synchronization using CDR pin 307, as further describer below, may provide a more accurate method of timing synchronization than available in the prior art. The method and apparatus described herein, in various embodiments, do not require redesign of external memory components, and thus are considerate of industry standards, and do not add circuitry to memory devices or increase power consumption of memory devices. In an embodiment, the information sent on CDR pin 307 is compared by CDR 305 to the information received on CDR pin 307 to determine whether it is necessary to adjust clock timing.

Figure 4:
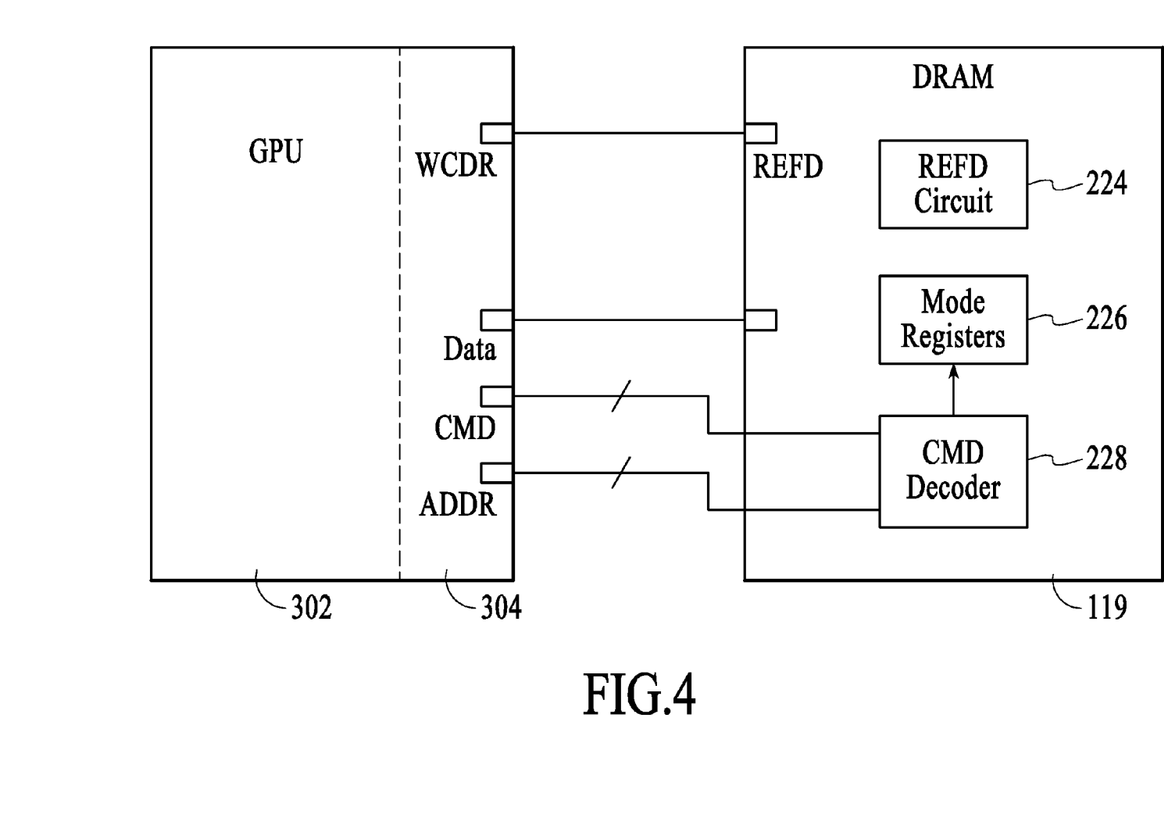
FIG. 4 is a diagram of particular system components according to an embodiment.

FIG. 4 is a diagram of particular system components of subsystem 301 according to an embodiment. In an embodiment GPU 304 communicates with a memory component 319. Memory component 319 may be included in either removable storage 322 or system memory 318, and is just one example of a memory component external to, but accessible to, GPU 302. In the example shown, memory component 119 is a dynamic random access memory DRAM component, but embodiments are not so limited. DRAM 119 includes a command (CMD) decoder 228, mode registers 226, and a "reference data" or REFD circuit 224. REFD circuit 224 typically receives a reference voltage on a REFD pin. In an embodiment, as further described below, DRAM 119 is configured by GPU 302 such that the REFD pin is reassigned to perform a different function from receiving a reference voltage. In this case, DRAM 119 has the capability to use an internally generated reference voltage instead of the received reference voltage.

The WCDR pin of system interface 304 is connected to the REFD pin of DRAM 119. The CMD pin and the ADDR pin of the system interface 304 are connected to the CMD decoder 208 of DRAM 119. In an embodiment, unused ADDR fields are used with one or more specific commands in order to modify mode registers 226. The modification causes CMD decoder 228 to rewrite (also referred to herein as reconfiguring mode registers 226 or reconfiguring the DRAM 119) mode registers 226. The reconfiguration disables the function of receiving a reference voltage on the REFD pin. The reconfigurations further causes DRAM 119 to interpret signals or information on the REFD pin in accordance with the timing synchronization method as described.

In an embodiment, for a WRITE transaction to DRAM 119, information or data is sent on the WCDR pin via the WCDR channel at the same time as WRITE data is sent on the DATA pin via the DATA channel. In an embodiment, the DATA channel connecting the DATA pin to DRAM 119 and the WCDR channel connecting the WCDR pin to DRAM 199 are similar. In response to the data sent via the WCDR channel, DRAM 119 returns the same data back to GPU 302 via the WCDR channel. CDR 305 of GPU 302 determines whether there are errors in the data and adjusts timing accordingly. In other embodiments, data sent by GPU 302 on the WCDR channel is encoded, received, decoded, and returned by DRAM 119. The returned data may be encoded before being returned, according to an embodiment. Errors are then detected in the returned data for the purpose of synchronizing timing. In the disclosure, the terms "data", "information", and "signal" may each be used for the data sent on the CDR channel as described above.

According to the embodiment of FIGS. 3 and 4, no modification of existing DRAMs is required. In addition, the same DRAM can be used in applications that include a controlling component with a WCDR channel and in applications that do not include a controlling component with a WCDR channel. In other embodiments, DRAM 119 can include an additional pin for receiving data sent via the WCDR channel. In yet other embodiments, a different pin other than the REFD pin can be reassigned to receive data via a WCDR channel.

In FIGS. 3 and 4, as in all of the examples given herein for purposes of describing the embodiments, a GPU is but one example of a controlling component, and a DRAM is but one example of a controlled component.

Figure 7:
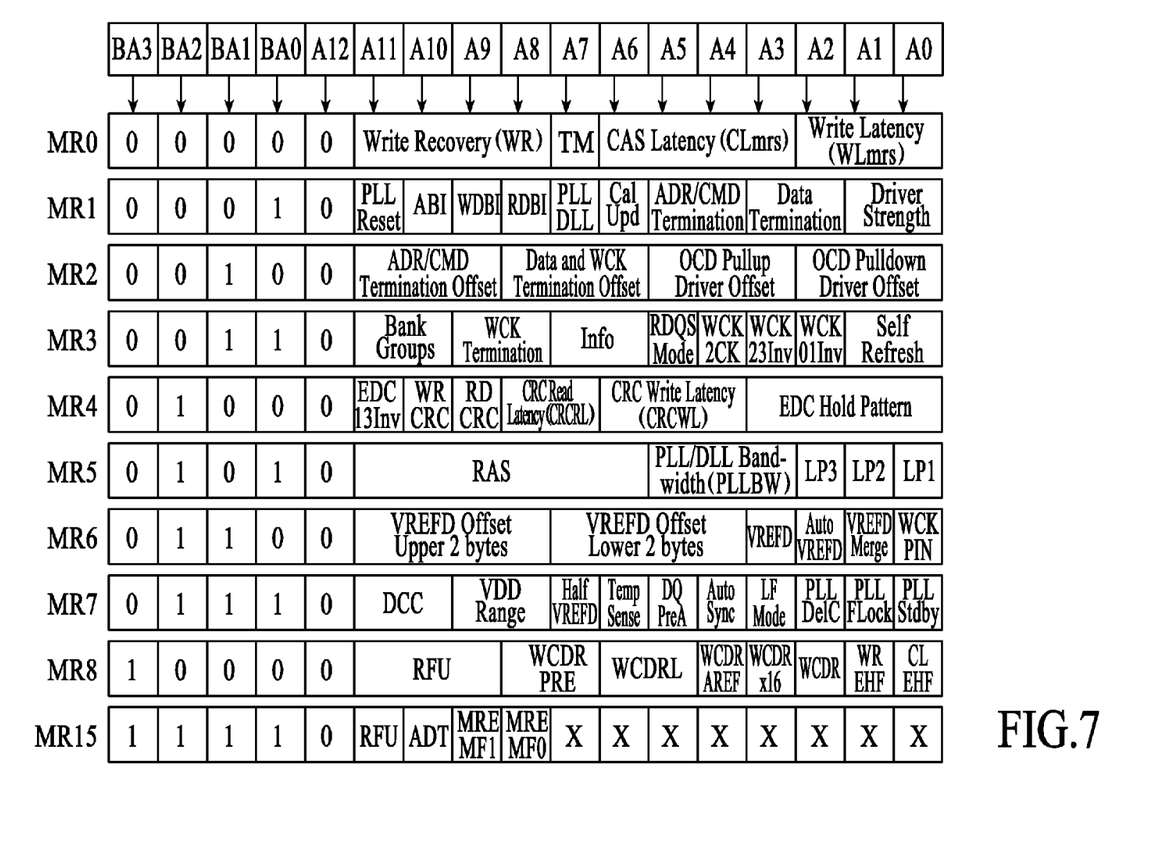
FIG. 7 is a diagram of a system component mode register according to an embodiment.

FIG. 7 is a diagram of a system component mode register according to an embodiment. In the example shown and according to an embodiment, the mode registers are modified in accordance with a proposed revision of the GDDR5 DRAM standard (referred to herein as "GDDR5"). Mode registers as shown are but one example of a control mechanism, and the example is not intended to be limiting. GDDR5 specifies 10 mode register (MRs) to define the mode of operation of the DRAM. MR0-MR8 and MR15 are defined as shown in prior art FIG. 5 (which can be referred to here again for purposes of comparison). MR9-MR14 are not defined and may be used by DRAM vendors for vendor-specific features. Reconfiguring or reprogramming mode registers does not affect the contents of the memory array. According to an embodiment, MR8 fields are written with values that configure the DRAM as described herein. Bits A11-A3 are written with to contain an RFU field, a WCDR PRE field, a WCDRL field, a WCDR AREF field, a WCDR ×16 field, and a WCDR field.

Figure 8:
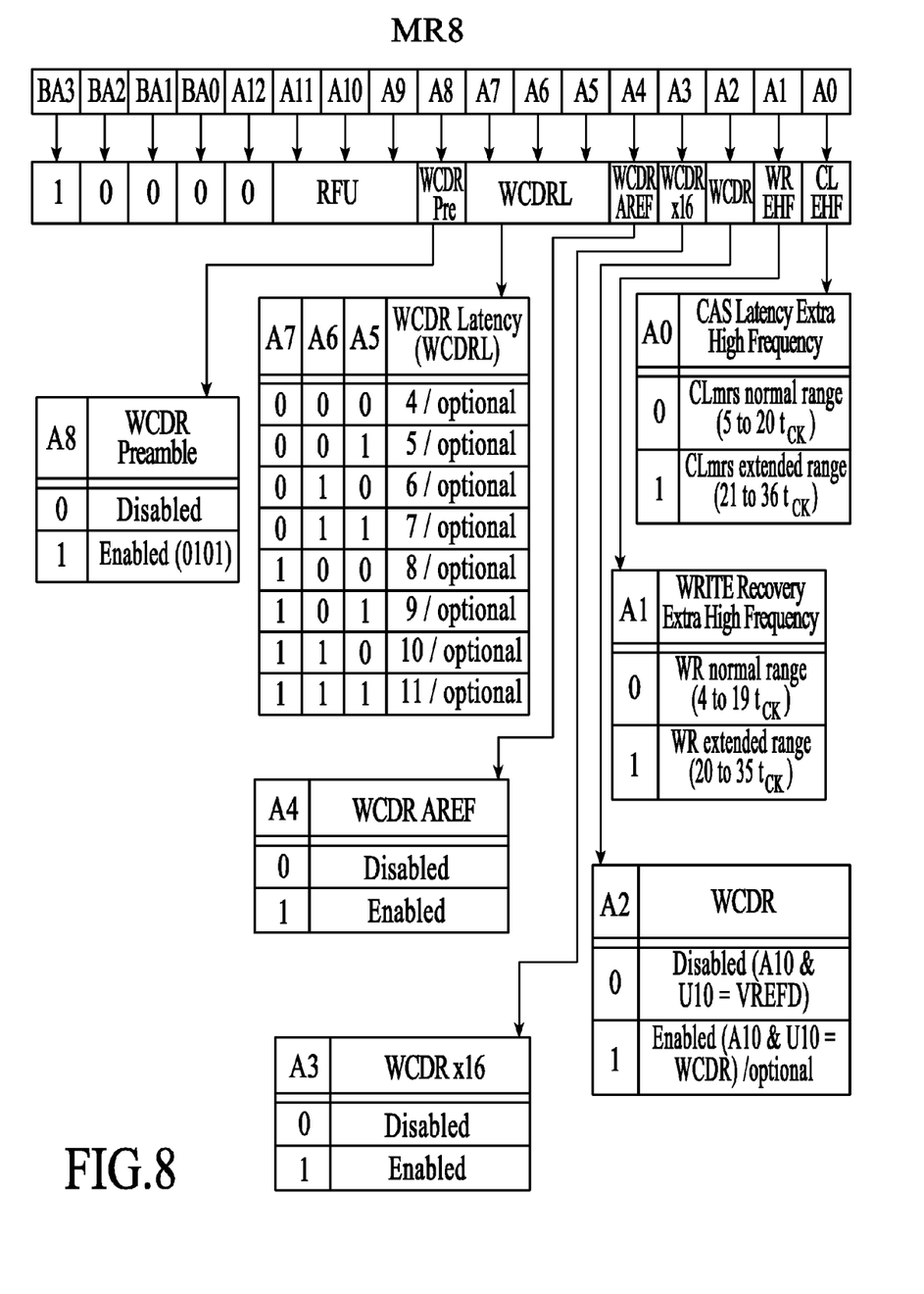
FIG. 8 is a diagram of one of the mode registers of FIG. 7.

FIG. 8 is a diagram further describing the values written in the fields of MR8 according to an embodiment. RFU bits make up a "reserved for future use" field and should be programmed to zero (according to one embodiment). A WCDR PRE bit enables and disables a WCDR preamble function. WCDRL bits specify a WCDR latency. Three WCDRL bits allow for 8 latency selections. A WCDR AREF bit enables and disables a WCDR AREF function. A bit enables and disables a WCDR preamble function ×16 bit enables and disables a WCDR ×16 function. A WCDR bit enables and disables the WCDR function. When WCDR is enabled, the VREF function of the DRAM is disabled. Specifically, bits A1 and A3 of MR 6 become "Don't Care".

Figure 9:
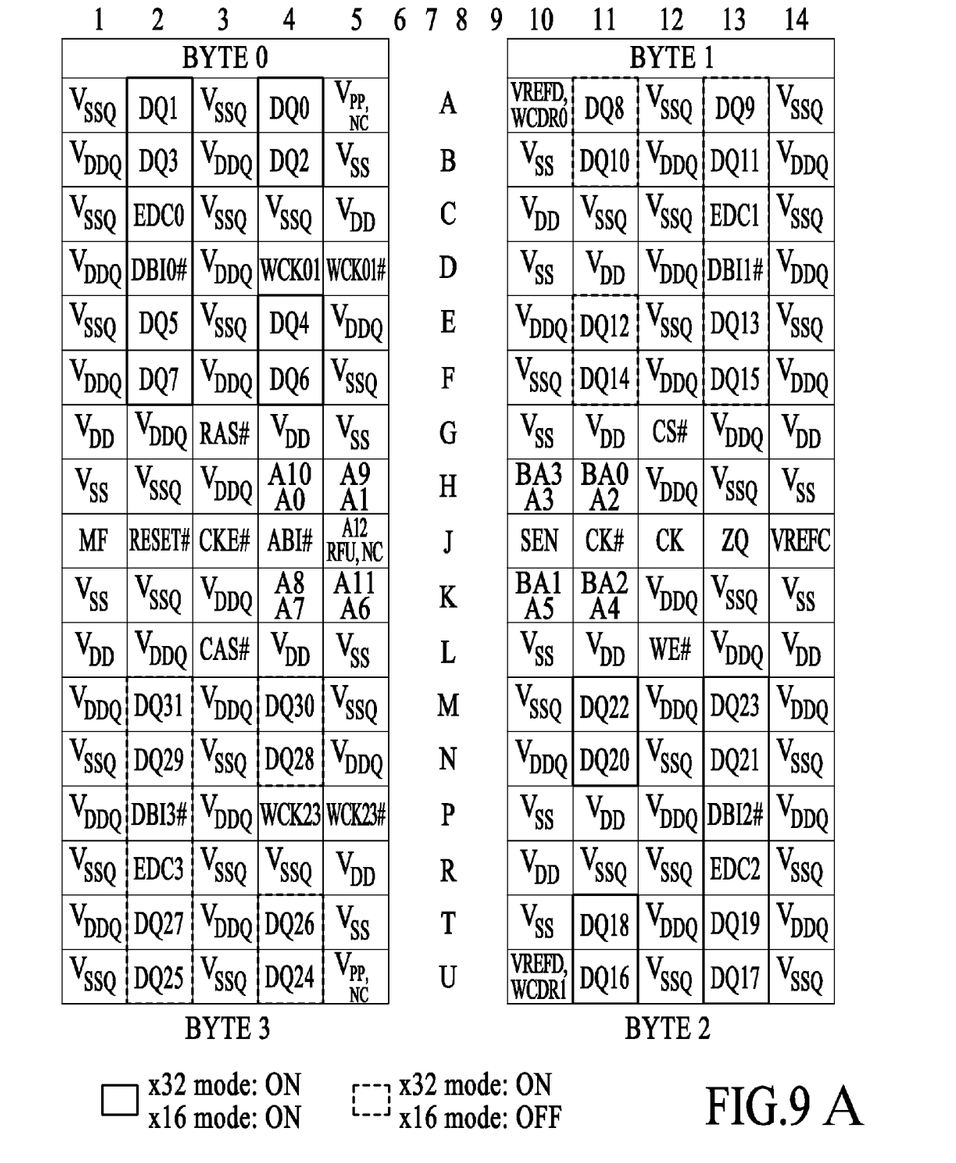
FIG. 9A is a ball-out diagram according to an embodiment.
FIG. 9B is a continuation of the ball-out diagram of FIG. 9A.
Figure 9B:
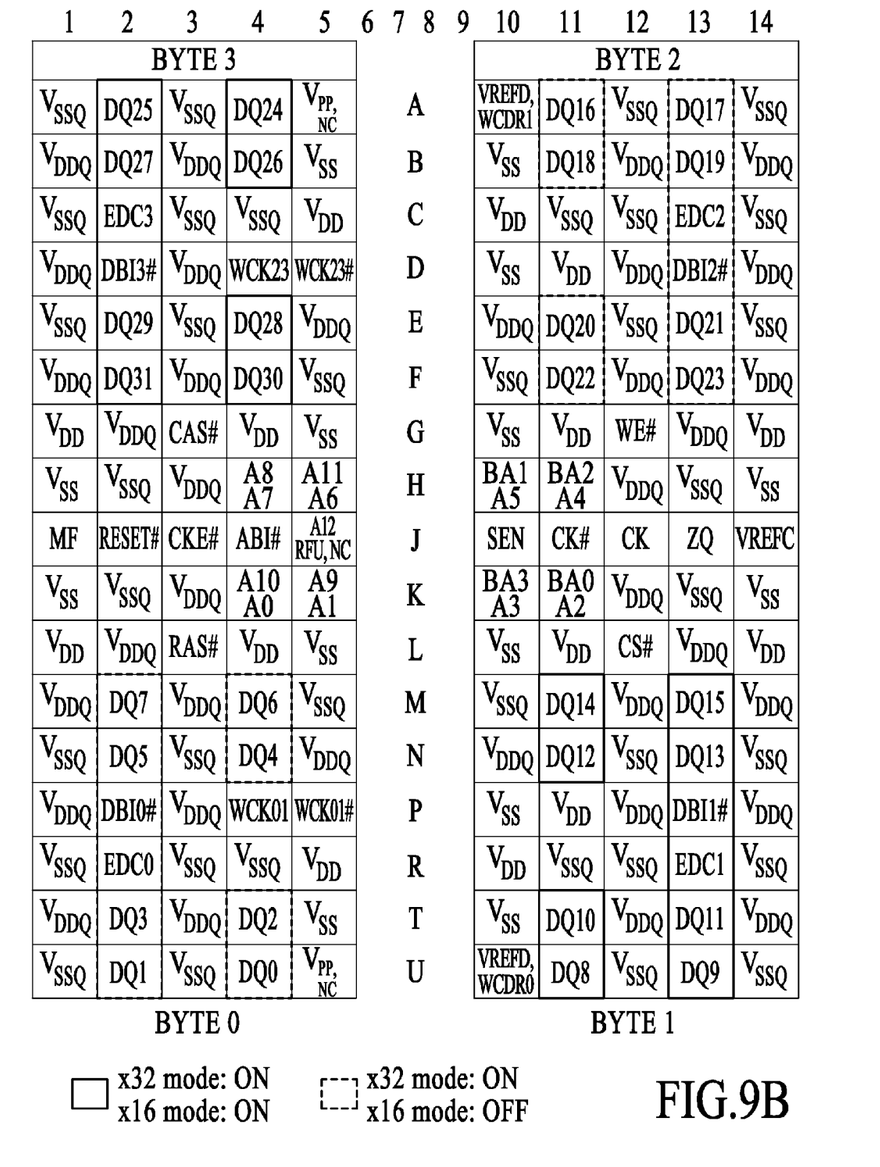

FIGS. 9A and 9B are a ball-out diagram according to an embodiment. As seen in the upper left corner of Bytes 1 and 2, VREFD shares an assignment with WCDR1, the CDR function.

An advantage provided by the embodiments is that an interface write timing protocol can be performed without the additional costs and routing complexity usually associated with a new pin. In the embodiments described, WRITE data is used on the CDR channel to obtain more accurate write clock timing. However, embodiments are not limited to write clock timing. Timing of many other signals can be adjusted in a similar manner.

Aspects of the embodiments described above may be implemented as functionality programmed into any of a variety of circuitry, including but not limited to programmable logic devices (PLDs), such as field programmable gate arrays (FPGAs), programmable array logic (PAL) devices, electrically programmable logic and memory devices, and standard cell-based devices, as well as application specific integrated circuits (ASICs) and fully custom integrated circuits. Some other possibilities for implementing aspects of the embodiments include microcontrollers with memory (such as electronically erasable programmable read only memory (EEPROM), Flash memory, etc.), embedded microprocessors, firmware, software, etc. Furthermore, aspects of the embodiments may be implemented in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies such as complementary metal-oxide semiconductor (CMOS), bipolar technologies such as emitter-coupled logic (ECL), polymer technologies (e.g., silicon-conjugated polymer and metal-conjugated polymer-metal structures), mixed analog and digital, etc.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number, respectively. Additionally, the words "herein," "hereunder," "above," "below," and words of similar import, when used in this application, refer to this application as a whole and not to any particular portions of this application. When the word "or" is used in reference to a list of two or more items, that word covers all of the following interpretations of the word, any of the items in the list, all of the items in the list, and any combination of the items in the list.

The above description of illustrated embodiments of the method and system is not intended to be exhaustive or to limit the invention to the precise forms disclosed. While specific embodiments of, and examples for, the method and system are described herein for illustrative purposes, various equivalent modifications are possible within the scope of the invention, as those skilled in the relevant art will recognize. As an example, although the anti-aliasing is generally described herein as an algorithm executed on hardware as a series of steps, the steps may be executed in an order other than the order described. In addition, the particular hardware or software components named, such as drivers, depth buffer, etc. are not meant to be exclusive or limiting.

The teachings of the disclosure provided herein can be applied to other systems, not only for systems including graphics processing or video processing, as described above. The various operations described may be performed in a very wide variety of architectures and distributed differently than described. In addition, though many configurations are described herein, none are intended to be limiting or exclusive.

In other embodiments, some or all of the hardware and software capability described herein may exist in a printer, a camera, television, a digital versatile disc (DVD) player, a DVR or PVR, a handheld device, a mobile telephone or some other device. The elements and acts of the various embodiments described above can be combined to provide further embodiments. These and other changes can be made to the method and system in light of the above detailed description.

In general, in the following claims, the terms used should not be construed to limit the method and system to the specific embodiments disclosed in the specification and the claims, but should be construed to include any processing systems and methods that operate under the claims. Accordingly, the method and system is not limited by the disclosure, but instead the scope of the method and system is to be determined entirely by the claims.

While certain aspects of the method and system are presented below in certain claim forms, the inventors contemplate the various aspects of the method and system in any number of claim forms. For example, while only one aspect of the method and system may be recited as embodied in computer-readable medium, other aspects may likewise be embodied in computer-readable medium. Computer-readable media include any data storage object readable by a computer including various types of compact disc: (CD-ROM), write-once audio and data storage (CD-R), rewritable media (CD-RW), DVD (Digital Versatile Disc" or "Digital Video Disc), as well as any type of known computer memory device. Such computer readable media may store instructions that are to be executed by a computing device (e.g., personal computer, personal digital assistant, PVR, mobile device or the like) or may be instructions (such as, for example, Verilog or a hardware description language) that when executed are designed to create a device (GPU, ASIC, or the like) or software application that when operated performs aspects described above. Accordingly, the inventors reserve the right to add additional claims after filing the application to pursue such additional claim forms for other aspects of the method and system.

What is claimed is:

1. A method for synchronizing clocks between coupled integrated circuits (ICs), the method comprising:
   providing a timing pin on a first IC, wherein the first IC is coupled to the second IC;
   configuring the second IC to change a pin assignment, wherein changing the pin assignment comprises interpreting a signal sent on the timing pin by the first IC and received on the reassigned pin as a request to transmit a return signal, wherein the return signal is received on the timing pin; and using the return signal to determine whether timing should be adjusted by the first integrated circuit, wherein adjusting comprises shifting a clocking signal.

2. The method of claim 1, wherein adjusting comprises the first IC comparing the signal sent on the timing pin by the first IC to the signal received on the timing pin.

3. The method of claim 1, wherein configuring comprises sending configuration data on one or more of a command bus and an address bus coupling the first IC and the second IC.

4. The method of claim 1, further comprising the signal sent on the timing pin by the first IC disabling a previous function of the second IC, wherein the previous function used a signal received by a same pin that receives the signal sent on the timing pin by the first IC.

5. The method of claim 1, wherein configuring comprises sending configuration data from the first IC to a command decoder of the second IC.

6. The method of claim 5, further comprising the second IC writing to at least one mode register of the second IC in response to receipt of the signal sent on the timing pin by the first IC.

7. The method of claim 1, wherein the second IC is a memory device.

8. The method of claim 7, wherein the first IC is a device comprising a processor that controls the second IC.

9. The method of claim 1, further comprising:
the first IC encoding the signal before sending the signal on the timing pin; and
the second IC decoding the signal, and transmitting the decoded signal as the return signal.

10. A system for timing synchronization between integrated circuit components, comprising:
a first integrated circuit (IC) for performing a specific function, the first integrated circuit comprising,
a clock and data recovery (CDR) circuit configured to analyze information received by the first IC from a second IC in the system to determine whether clock timing of the first IC should be adjusted; and
a CDR pin configured to send information to the second IC and to receive the information from the second IC in response, wherein the information is used by the CDR circuit to make the determination.

11. The system of claim 10, wherein the first IC is further configurable to send information to configure the second IC, wherein configuring comprises causing the second IC to reassign a pin to receive and interpret the information sent from the CDR pin as a request to return the information to the first IC.

12. The system of claim 11, wherein configuring the second IC comprises the first IC sending configuration data via one or more of a command channel and an address channel coupling the first IC and the second IC.

13. The system of claim 11, wherein reassigning comprises reassigning a reference voltage pin of the second IC to receive information from the CDR pin of the first IC.

14. The system of claim 10, wherein the second IC is a memory device controlled by the first IC.

15. The system of claim 14, wherein configuring the second IC comprises writing values to a mode register of the second IC.

16. A system for timing synchronization between integrated circuit components, comprising:
a first integrated circuit (IC) comprising,
a clock and data recovery (CDR) circuit configurable to analyze information received by the first IC from other ICs in the system to determine whether clock timing of the first IC should be adjusted; and
a CDR pin coupled to the CDR circuit; a second IC coupled to the first IC, wherein the second IC is controlled by the first IC, the second IC comprising,
a CDR pin coupled to the CDR pin of the first IC via a CDR channel, wherein the second IC is configurable to receive information sent from the first IC via the CDR channel and, in response, send the information to be analyzed by the first IC via the CDR channel.

17. The system of claim 16 wherein the first IC is further configurable to encode the information sent via the CDR channel, and wherein the second IC if further configurable to decode the information and to send the decoded information as the information to be analyzed.

18. An integrated circuit (IC) comprising:
a clock recovery pin configurable to send information on a clock and data recover (CDR) channel to another component, and to receive information from the other component on the CDR channel; and
a CDR circuit configurable to synchronize clock timing between the IC and the other component using the information received by the clock recovery pin from the other component to adjust timing of the IC.

19. The IC of claim 18, wherein a processor is configurable to transmit configuration data to the other component that causes the other component to interpret the information on the CDR channel as a request to return the information to the IC on the CDR channel.

20. The IC of claim 18, wherein transmitting configuration data comprises sending the data using one or more of a data channel and an address channel.

21. The IC of claim 18, wherein transmitting configuration data comprises sending the data to a command decoder of the other component.

22. An integrated circuit (IC) comprising:
a configurable pin circuit adapted to be configured to receive signals from a coupled IC, the signals comprising a first signal type at a first time and a second signal type at a second time, said first signal type being different from said second signal type; and
said configurable pin circuit adapted to transmit a return signal, wherein the return signal is based on received signals of the second signal type, wherein the coupled IC uses the return signal to determine whether signal timing should be adjusted by the coupled IC, and wherein adjusting comprises shifting a clocking signal.

* * * * *